US010461917B2

(12) United States Patent
Meninger

(10) Patent No.: US 10,461,917 B2
(45) Date of Patent: *Oct. 29, 2019

(54) SERIALIZER/DESERIALIZER (SERDES) LANES WITH LANE-BY-LANE DATARATE INDEPENDENCE

(71) Applicant: Cavium, LLC, Santa Clara, CA (US)

(72) Inventor: Scott E. Meninger, Groton, MA (US)

(73) Assignee: Cavium, LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/352,180

(22) Filed: Mar. 13, 2019

(65) Prior Publication Data

US 2019/0215142 A1 Jul. 11, 2019

Related U.S. Application Data

(63) Continuation of application No. 15/721,334, filed on Sep. 29, 2017, now Pat. No. 10,291,386.

(51) Int. Cl.
*H04L 7/00* (2006.01)
*H03L 7/00* (2006.01)
(Continued)

(52) U.S. Cl.
CPC .............. *H04L 7/0008* (2013.01); *H03L 7/00* (2013.01); *H03L 7/08* (2013.01); *H04L 1/0065* (2013.01); *H04L 27/2272* (2013.01)

(58) Field of Classification Search
CPC combination set(s) only.
See application file for complete search history.

(56) References Cited

U.S. PATENT DOCUMENTS 7,499,513 B1 3/2009 Tetzlaff et al.
7,961,833 B2 * 6/2011 Albasini ............... H03L 7/0891
375/376
(Continued)

FOREIGN PATENT DOCUMENTS

WO 2019/067194 A1 4/2019

OTHER PUBLICATIONS

International Search Report and Written Opinion for Int'l Application No. PCT/US2018/050282, titled Serializer/Deserializer (SERDES) Lanes With Lane-by-Lane Datarate Independence; dated Dec. 6, 2018.
(Continued)

*Primary Examiner* — Linda Wong
(74) *Attorney, Agent, or Firm* — Hamilton, Brook, Smith & Reynolds, P.C.

(57) ABSTRACT

A circuit and method enables multiple serializer/deserializer (SerDes) data lanes of a physical layer device (PHY) to operate across a broad range of diversified data rates that are independent from lane to lane. The multiple SerDes data lanes may operate at data rates independent from one another. A single low frequency clock is input to the PHY. A frequency of the single low frequency clock is increased via a common integer-N phase-locked loop (PLL) on the PHY to produce a higher frequency clock. Each of the SerDes data lanes is operated, independently, as a fractional-N PLL that employs the higher frequency clock. Use of the common integer-N PLL enables modulation noise of the fractional-N PLLs to be suppressed by moving the modulation noise to higher frequencies where a level of the modulation noise is filtered, avoiding use of high risk noise cancellation techniques.

34 Claims, 10 Drawing Sheets

(51) Int. Cl.
*H03L 7/08* (2006.01)
*H04L 27/227* (2006.01)
*H04L 1/00* (2006.01)

(56) References Cited

U.S. PATENT DOCUMENTS

| | | | |
|---|---|---|---|
| 8,037,336 B2 | 10/2011 | Chawla | |
| 8,537,952 B1* | 9/2013 | Arora | H03C 3/0925 |
| | | | 375/354 |
| 8,537,956 B1 | 9/2013 | Pham et al. | |
| 9,203,418 B2 | 12/2015 | Mohajeri et al. | |
| 9,219,560 B2 | 12/2015 | Hummel | |
| 9,286,825 B2* | 3/2016 | Li | G09G 5/12 |
| 9,306,730 B1 | 4/2016 | Shu et al. | |
| 9,344,271 B1 | 5/2016 | Dusatko | |
| 9,531,390 B1* | 12/2016 | Choi | H03L 7/0805 |
| 10,003,346 B2 | 6/2018 | Sjöland et al. | |
| 2004/0022238 A1 | 2/2004 | Kimmitt | |
| 2004/0036639 A1 | 2/2004 | Hammes et al. | |
| 2006/0071691 A1 | 4/2006 | Garlepp | |
| 2008/0048791 A1* | 2/2008 | Fahim | H03L 7/085 |
| | | | 331/1 A |
| 2008/0129351 A1 | 6/2008 | Chawla | |
| 2008/0136532 A1* | 6/2008 | Hufford | H03L 7/081 |
| | | | 331/10 |
| 2008/0197891 A1 | 8/2008 | Park et al. | |
| 2009/0160565 A1 | 6/2009 | Kawamoto | |
| 2010/0127739 A1 | 5/2010 | Ebuchi et al. | |
| 2010/0207693 A1* | 8/2010 | Fagg | H03L 7/185 |
| | | | 331/10 |
| 2011/0102032 A1 | 5/2011 | Zeller | |
| 2011/0175652 A1* | 7/2011 | Kuo | H03L 7/1976 |
| | | | 327/148 |
| 2011/0193601 A1* | 8/2011 | Albasini | H03L 7/0891 |
| | | | 327/156 |
| 2012/0086491 A1 | 4/2012 | Scouten et al. | |
| 2012/0200328 A1* | 8/2012 | Yao | H03L 7/1976 |
| | | | 327/157 |
| 2013/0043917 A1 | 2/2013 | de Cesare et al. | |
| 2013/0113533 A1 | 5/2013 | Aaltonen et al. | |
| 2013/0285722 A1* | 10/2013 | Chou | H03L 7/0898 |
| | | | 327/157 |
| 2013/0300470 A1* | 11/2013 | Mohajeri | H03L 7/1075 |
| | | | 327/157 |
| 2014/0177770 A1* | 6/2014 | Katumba | H03L 7/093 |
| | | | 375/374 |
| 2014/0225653 A1* | 8/2014 | Hara | H03L 7/235 |
| | | | 327/159 |
| 2014/0292388 A1* | 10/2014 | Mohajeri | H03L 7/1075 |
| | | | 327/157 |
| 2015/0109284 A1* | 4/2015 | Li | G09G 5/12 |
| | | | 345/213 |
| 2015/0145571 A1* | 5/2015 | Perrott | H03L 7/093 |
| | | | 327/159 |
| 2015/0162917 A1* | 6/2015 | Tsukuda | H03L 7/197 |
| | | | 327/115 |
| 2015/0349788 A1* | 12/2015 | Namdar-Mehdiabadi | |
| | | | H03L 7/1978 |
| | | | 327/156 |
| 2015/0372690 A1 | 12/2015 | Tertinek et al. | |
| 2016/0112053 A1* | 4/2016 | Perrott | H03L 7/093 |
| | | | 327/156 |
| 2016/0248608 A1 | 8/2016 | Fiedler | |
| 2016/0359508 A1 | 12/2016 | Hadji-Abdolhamid et al. | |
| 2017/0093604 A1 | 3/2017 | Dan | |
| 2017/0097613 A1 | 4/2017 | Tertinek et al. | |
| 2017/0187481 A1 | 6/2017 | Huang et al. | |
| 2017/0366376 A1* | 12/2017 | Wang | H03L 7/093 |
| 2018/0054293 A1 | 2/2018 | Hossain et al. | |
| 2018/0138915 A1* | 5/2018 | Jenkins | H03L 7/087 |
| 2018/0145695 A1* | 5/2018 | Lahiri | H03L 7/1976 |
| 2018/0198454 A1* | 7/2018 | Sjoland | H03L 7/081 |
| 2019/0103956 A1* | 4/2019 | Meninger | H03L 7/00 |

OTHER PUBLICATIONS

Texas Instruments, "Fractional/Integer-N PLL Basics," Aug. 1999, Wireless Communication Business Unit, Texas Instruments, Technical Brief SWRA029, pp. 1-55 (Year: 1999).

\* cited by examiner

SERIALIZER/DESERIALIZER (SERDES) LANES WITH LANE-BY-LANE DATARATE INDEPENDENCE

RELATED APPLICATION

This application is a continuation of U.S. application Ser. No. 15/721,334, filed on Sep. 29, 2017, now U.S. Pat. No. 10,291,386. The entire teachings of the above application are incorporated herein by reference.

BACKGROUND

Physical layer devices (PHYs) may include multiple Serializer/Deserializer (SerDes) lanes. Each SerDes lane may include a serializer block and a deserializer block. The serializer block generally converts data from a parallel format to a serial format. The deserializer block generally converts data from a serial format to a parallel format.

SUMMARY

According to an example embodiment, a circuit on a chip for serial data applications may comprise a common phase-locked loop (PLL). The common PLL may be configured to receive an off-chip reference clock signal generated external to the chip and produce an on-chip reference clock signal. The on-chip reference clock signal may be higher in frequency relative to the off-chip reference clock signal. The circuit may comprise a plurality of serializer/deserializer (SerDes) lanes each composed of a respective transmitter, receiver, and fractional-N (frac-N) PLL. The on-chip reference clock signal may be distributed to each respective frac-N PLL for use in generating a respective output clock signal with a respective frequency. The respective transmitter and receiver of each SerDes lane may be configured to operate at respective transmit and receive data rates. The respective transmit and receive data rates may be based on the respective frequency and may be independent of data rates of other SerDes lanes of the plurality of SerDes lanes.

The off-chip reference clock signal may be configured to operate in a low frequency range of 100 MHz to 156 MHz and the on-chip reference clock signal may be configured to operate in a higher frequency range of 400 MHz to 600 MHz.

The circuit may be configured to suppress a respective modulation noise, generated by each respective frac-N PLL, by increasing frequency of the respective modulation noise to enable each respective frac-N PLL to filter the respective modulation noise.

Each respective frac-N PLL of the plurality of SerDes lanes may be composed of a respective divider and sigma-delta modulator. Each respective sigma-delta modulator may be configured to modulate, randomly, a respective divide value of the respective divider.

The common PLL may be an integer PLL with a multiplying factor and the multiplying factor may be configured to suppress an initial portion of quantization noise introduced by modulating each respective divide value of each respective divider of each respective frac-N PLL of the plurality of SerDes lanes.

Each respective frac-N PLL of the plurality of SerDes lanes may be further composed of a respective out-of-band parasitic pole configured to suppress a remaining portion of the quantization noise. The remaining portion may be at higher offset frequencies relative to offset frequencies of the initial portion. The initial portion and the remaining portion may be suppressed below a noise level of noise generated from intrinsic phase detector and voltage controlled oscillator (VCO) noise sources on the chip.

The integer PLL may be a first integer PLL and each respective out-of-band parasitic pole may be configured high enough to not affect closed-loop behavior of the respective frac-N PLL. Each respective out-of-band parasitic pole in combination with configuration of the multiplying factor may enable jitter and phase noise performance of each respective frac-N PLL of the plurality of SerDes lanes to be comparable to that of a second integer PLL that employs a same integer divide value as the respective frac-N PLL.

Each respective frac-N PLL of the plurality of SerDes lanes may have an order that is lower relative to that of the respective sigma-delta modulator.

The order of each respective frac-N PLL may be two and that of the respective sigma-delta modulator may be three.

Each respective frac-N PLL of the plurality of SerDes lanes may be composed of a respective spread spectrum clock (SSC) pattern generator configured to modulate the respective frac-N PLL, directly, according to a respective SSC profile.

The chip may be a physical layer device (PHY). Each SerDes lane may be configured to employ the respective transmit and receive data rates to communicate with a respective media access controller (MAC). The respective transmit and receive data rates may be configured independent of data rates employed by other SerDes lanes of the PHY for communicating with other MACs.

According to another example embodiment, a method may comprise producing an on-chip reference clock signal from a common phase-locked loop (PLL) on a chip based on an off-chip reference clock signal generated external to the chip. The on-chip reference clock signal may be higher in frequency relative to the off-chip reference clock signal. The method may comprise distributing the on-chip reference clock signal to each respective frac-N PLL of a plurality of serializer/deserializer (SerDes) lanes each composed of a respective transmitter, receiver, and fractional-N (frac-N) PLL. The method may comprise generating a respective output clock signal with a respective frequency from each respective frac-N PLL based on the on-chip reference clock signal distributed. The method may comprise operating each respective transmitter and receiver of each SerDes lane at respective transmit and receive data rates based on the respective frequency and may be independent of data rates of other SerDes lanes of the plurality of SerDes lanes.

The method may comprise operating the off-chip reference clock signal in a low frequency range of 100 MHz to 156 MHz and operating the on-chip reference clock signal in a higher frequency range of 400 MHz to 600 MHz.

The method may comprise suppressing a respective modulation noise, generated by each respective frac-N PLL, by increasing frequency of the respective modulation noise to enable each respective frac-N PLL to filter the respective modulation noise.

Each respective frac-N PLL of the plurality of SerDes lanes may be composed of a respective divider and sigma-delta modulator. The method may further comprise employing each respective sigma-delta modulator to modulate, randomly, a respective divide value of the respective divider.

The common PLL may be an integer PLL with a multiplying factor and the method may further comprise configuring the multiplying factor to suppress an initial portion of quantization noise introduced by modulating each respective divide value of each respective divider of each respective frac-N PLL of the plurality of SerDes lanes.

Each respective frac-N PLL of the plurality of SerDes lanes may be further composed of a respective out-of-band parasitic pole and the method may further comprise configuring each respective out-of-band parasitic pole to suppress a remaining portion of the quantization noise. The remaining portion may be at higher offset frequencies relative to offset frequencies of the initial portion. The initial portion and the remaining portion may be suppressed below a noise level of noise generated from intrinsic phase detector and voltage controlled oscillator (VCO) noise sources on the chip.

The integer PLL may be a first integer PLL and configuring each respective out-of-band parasitic pole may include configuring each respective out-of-band parasitic pole to be high enough to not affect closed-loop behavior of the respective frac-N PLL. Each respective out-of-band parasitic pole in combination with configuration of the multiplying factor may enable jitter and phase noise performance of each respective frac-N PLL of the plurality of SerDes lanes to be comparable to that of a second integer PLL that employs a same integer divide value as the respective frac-N PLL.

The method may further comprise configuring each respective frac-N PLL of the plurality of SerDes lanes to have an order that is lower relative to that of the respective sigma-delta modulator. The order of each respective frac-N PLL may be two and that of the respective sigma-delta modulator may be three.

Each respective frac-N PLL of the plurality of SerDes lanes may be composed of a respective spread spectrum clock (SSC) pattern generator and the method may further comprise configuring each respective SSC pattern generator to modulate the respective frac-N PLL, directly, according to a respective SSC profile.

The chip may be a physical layer device (PHY), and the method may further comprise configuring each SerDes lane to employ the respective transmit and receive data rates to communicate with a respective media access controller (MAC) and configuring the respective transmit and receive data rates independent of data rates employed by other SerDes lanes of the PHY for communicating with other MACs.

It should be understood that example embodiments disclosed herein can be implemented in the form of a method, apparatus, system, or computer readable medium with program codes embodied thereon.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

In serial data applications it may be useful to have serializer/deserializer (SerDes) lanes (also referred to interchangeably herein as SerDes data lanes) of a physical layer device (PHY) operate over a broad range of data rates and serial protocols. In addition, for maximum flexibility in connecting to external components, it may also be useful to have the PHY connect to multiple logical layer media access controllers (MACs) so that the PHY can be programmed at chip startup to communicate with a particular protocol for a particular application or board design while using a same piece of provider silicon. As such, a PHY with SerDes lanes configured to span a wide range of operational frequencies and protocol requirements may be useful.

Within the PHY, also referred to interchangeably herein as a SerDes PHY, a plurality of SerDes lanes may be configured to communicate with external devices. The SerDes lanes may be composed primarily of a transmitter (TX) and a receiver (RX) to enable such communication. Embodiments disclosed herein enable multiple SerDes data lanes of a PHY to operate across a broad range of diversified data rates from lane to lane without placing difficult constraints with respect to clocking requirements for clocking signal being provided to the SerDes data lanes. An example embodiment relieves a customer who is employing the PHY in their design from adhering to such difficult constraints. For example, the customer may employ low frequency clock signals readily available in their design and are relieved from having to generate a high frequency clock signal that may otherwise be required by the PHY.

According to an example embodiment, each SerDes lane may operate at a completely independent data rate from one another based on a single low frequency reference clock signal input. Achieving such lane-by-lane datarate independence may be enabled by operating each SerDes lane as a fractional-N (frac-N) frequency synthesizer and by using a common phase locked loop (PLL) on the PHY as a frequency step-up PLL for increasing frequency of the single low frequency reference clock signal input.

The use of the step-up PLL avoids having to do any high risk quantization noise cancellation techniques that exist in the art and provides an additional benefit of suppressing a frac-N modulation noise by moving the frac-N noise to higher frequencies where such noise may be filtered by the frac-N PLL. Example embodiments of a fractional modulator, PLL loop dynamics, and additional PLL filtering poles enables a level of the frac-N modulation noise to be suppressed to a point where phase noise and jitter of the frac-N PLL appears identical to that of an integer-N PLL, as disclosed further below.

Figure 1:
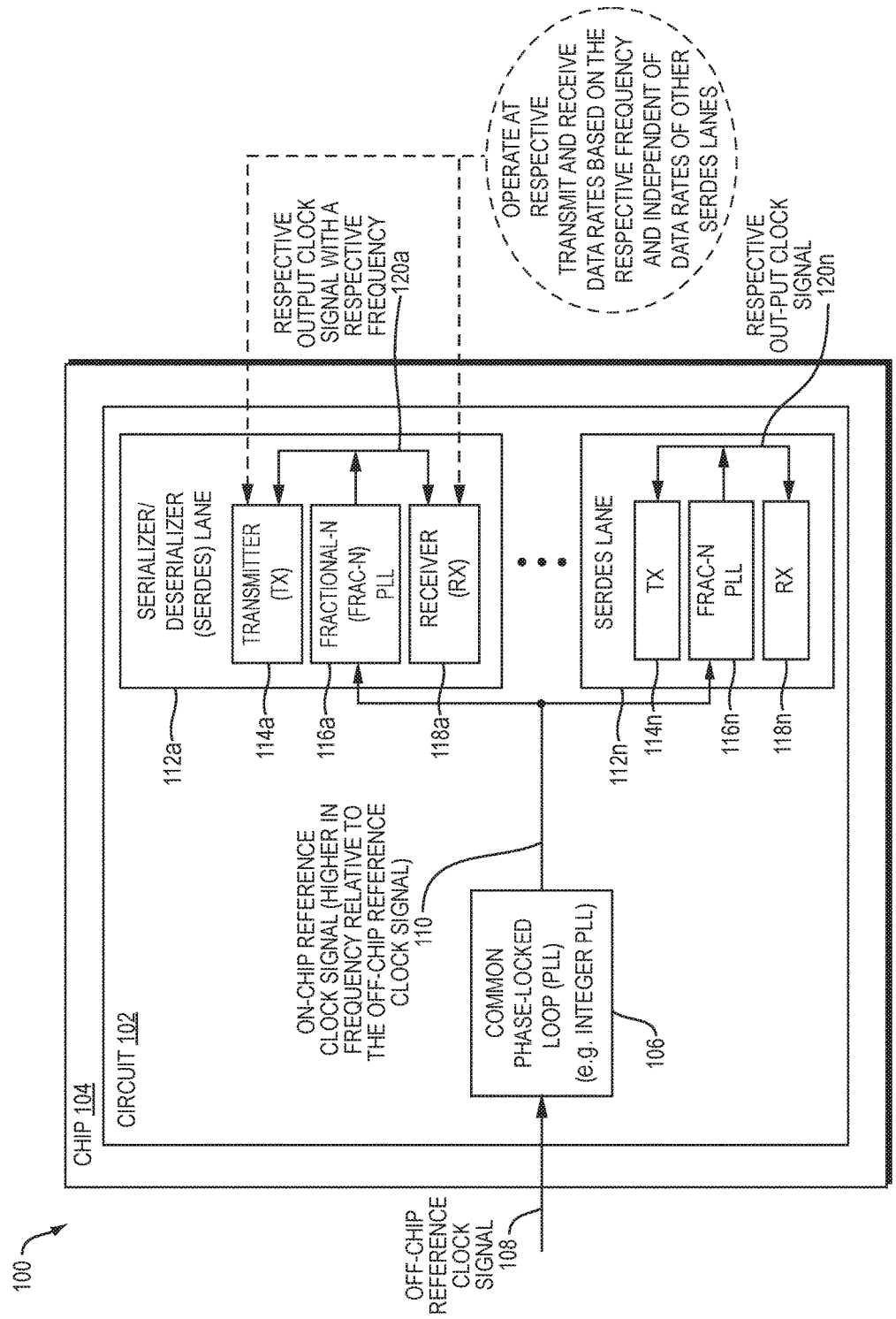
FIG. 1 is a block diagram of an example embodiment of a circuit on a chip for serial data applications.

FIG. 1 is a block diagram 100 of an example embodiment of a circuit 102 on a chip 104 for serial data applications. The circuit 102 comprises a common phase-locked loop (PLL) 106. The common PLL 106 is configured to receive an off-chip reference clock signal 108 generated external to the chip 104 and to produce an on-chip reference clock signal 110. The on-chip reference clock signal 110 is higher in frequency relative to the off-chip reference clock signal 108. The circuit 102 comprises a plurality of serializer/deserializer (SerDes) lanes, that is, the SerDes lanes 112a-n that may be any suitable number of SerDes lanes. Each of the SerDes lanes 112a-n is composed of a respective transmitter, receiver, and fractional-N (frac-N) PLL, such as the transmitters 114a-n, receivers 116a-n, and frac-N PLLs 118a-n of the SerDes lanes 112a-n, respectively. The on-chip reference clock signal 110 is distributed to each respective frac-N PLL, that is, the frac-N PLLs 118a-n, for use in generating a respective output clock signal, that is, the output clock signals 120a-n of the frac-N PLLs 118a-n, respectively, that are each associated with a respective frequency. The respective transmitter and receiver of each SerDes lane, such as the transmitters 114a-n and receivers 118a-n of the SerDes lanes 112a-n, respectively, may each be configured to operate at respective transmit and receive data rates. The respective transmit and receive data rates may be based on the respective frequency and may be independent of data rates of other SerDes lanes of the plurality of SerDes lanes that include the SerDes lanes 112a-n. The transmit and receive data rates may be a same data rate. Alternatively, the transmit and receive data rates may be different data rates.

The off-chip reference clock signal 108 may be configured to operate in a low frequency range of 100 MHz to 156 MHz and the on-chip reference clock signal 110 may be configured to operate in a higher frequency range of 400 MHz to 600 MHz.

The chip 104 may be a physical layer device (PHY). Each SerDes lane 112a-n may be configured to employ the respective transmit and receive data rates to communicate with a respective media access controller (MAC) (not shown) and external devices (not shown). The respective transmit and receive data rates may be configured independent of data rates employed by other SerDes lanes of the PHY for communicating with other MACs.

Figure 2:
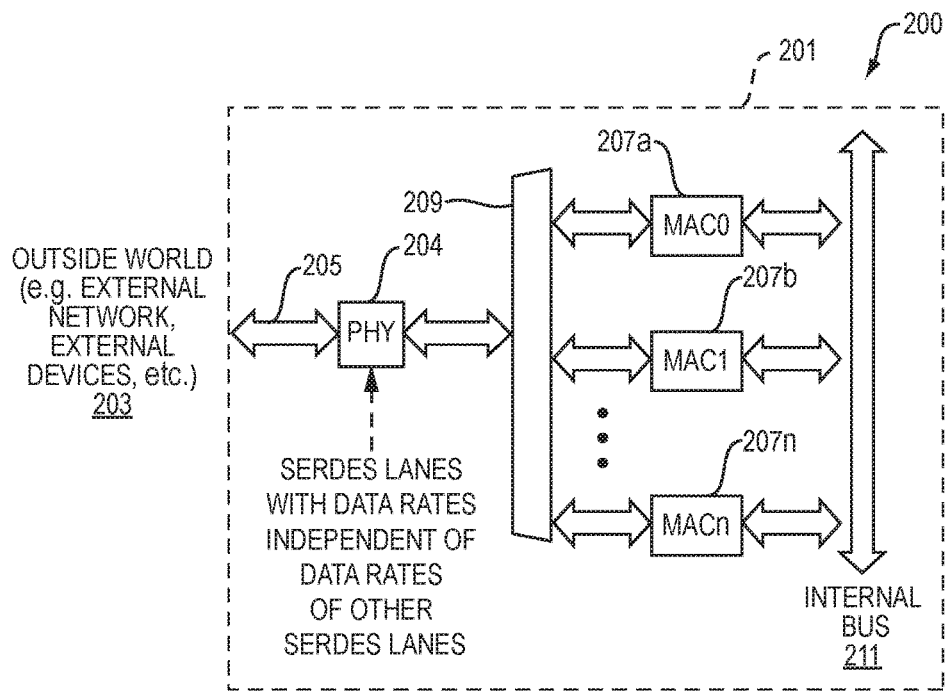
FIG. 2 is a block diagram of an example embodiment of an apparatus for serial data applications.

FIG. 2 is a block diagram 200 of an example embodiment of an apparatus 201 for serial data communications. The apparatus 201 includes a PHY 204 that is composed of a circuit (not shown), such as the circuit 102 disclosed above with reference to FIG. 1, that enables SerDes lanes of the PHY 204 to operate at independent data rates on a lane-by lane basis.

The PHY 204 is configured to communicate with an outside world 203, such as an external network or external device, via a first interface 205. The first interface 205 may be an interface to a physical medium, such as an optical fiber or copper cable, or may be a wireless interface or any other suitable interface for communicating with external devices.

The apparatus 201 may comprise multiple logical layer media access controllers (MACs), such as the MACs 207a-n, and a second interface 209. The second interface 209 may be a logical multiplexer or media independent interface (MII) disposed between the PHY 204 with the plurality of MACs 207a-n. The plurality of MACs 207a-n may have respective requirements for communication, such as respective requirements for data rates. Each MAC of the plurality of MACs 207a-n may be configured to deliver data between an internal bus 211 of the apparatus 201 and the outside world 203 via a respective SerDes lane (not shown) of the PHY 204. According to an example embodiment, such respective SerDes lanes may be configured to operate at respective transmit and receive data rates that are independent of data rates employed by other SerDes lanes of the PHY 204.

According to an example embodiment of the circuit (not shown) of the PHY 204, such as the example embodiment of the circuit 102 of FIG. 1, disclosed above, each SerDes lane (not shown) of the PHY 204 may be operated independently and need not be grouped with any other SerDes lane based on a common interface requirement for communicating with its respective MAC of the plurality of MACs 207a-n.

Figure 3:
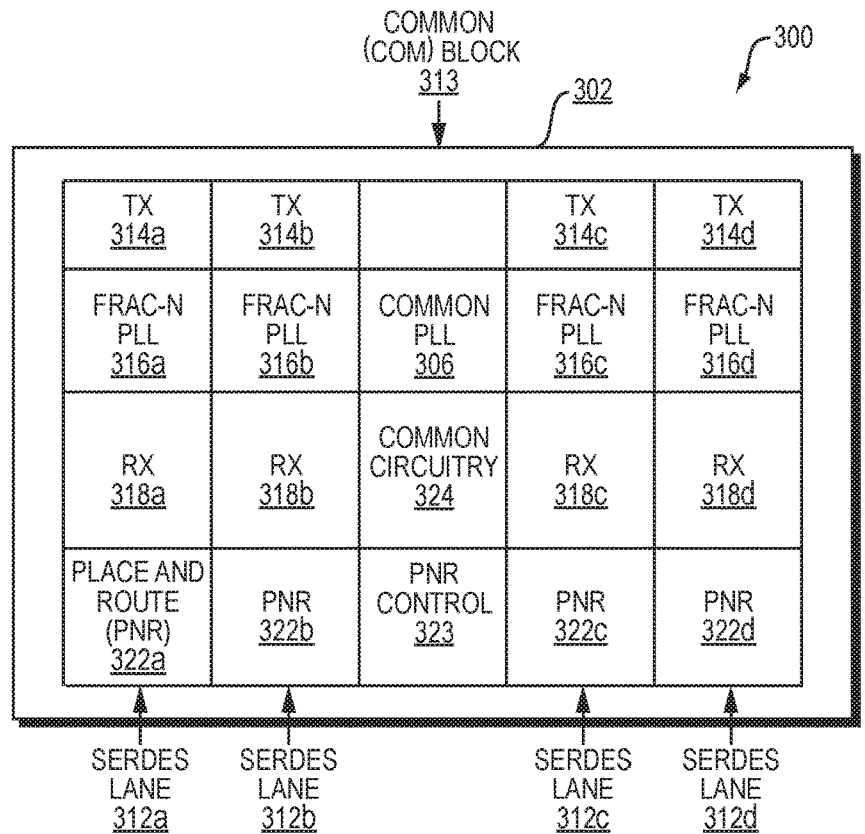
FIG. 3 is a block diagram of an example embodiment of a circuit for serial data applications.

FIG. 3 is a block diagram 300 of an example embodiment of a circuit 302 for serial data applications. The circuit 302 includes four SerDes lanes, that is, the SerDes lanes 312a-d, along with a common (COM) block 313. It should be understood that the four SerDes lanes, also referred to herein as a quad lane module (QLM) configuration, is for illustrative purposes and that any suitable number of SerDes lanes may be employed. Each SerDes lane includes a TX, RX, and frac-N PLL. For example, the SerDes lane 312a includes the TX 314a, RX 318a, and frac-N 316a. The SerDes lane 312b includes the TX 314b, RX 318b, and frac-N 316b. The SerDes lane 312c includes the TX 314c, RX 318c, and frac-N 316c, while the SerDes lane 312d includes the TX 314d, RX 318d, and frac-N 316d.

Each SerDes lane further includes digital circuitry to interface to a respective logical MAC (not shown) that may be placed by place and route (PNR) tools and referred to interchangeably herein as PNR. For example, the SerDes lanes 312a, 312b, 312c, and 312d include the PNR 322a, 322b, 322c, and 322d, respectively, for interfacing to respective logical MACs (not shown). Included in the COM block 313 is control circuitry that includes the PNR control circuitry 323 that may be used for controlling the PNR 322a, 322b, 322c, and 322d. The COM block 313 further includes a common PLL 306 that may be an integer PLL and COM circuitry 324 that may include miscellaneous circuitry that is common within the circuit 302.

Figure 4:
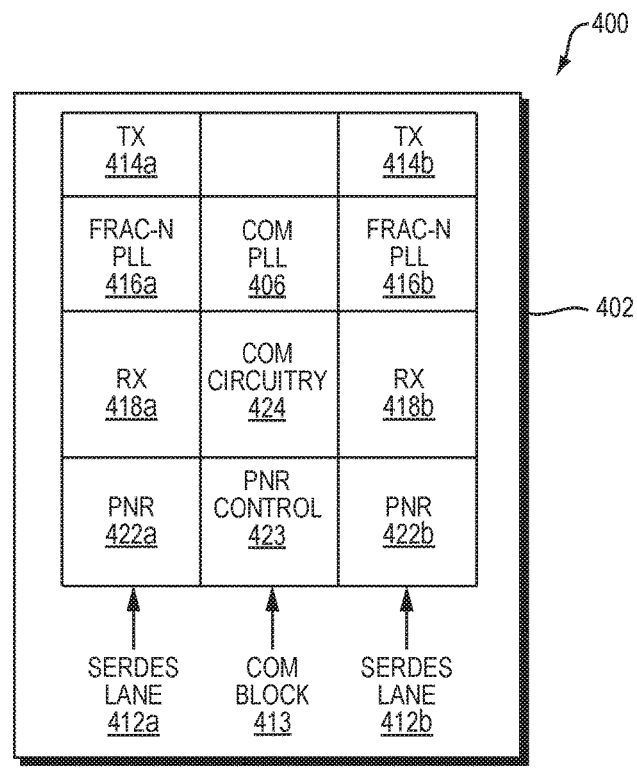
FIG. 4 is a block diagram of another example embodiment of a circuit for serial data applications.

FIG. 4 is a block diagram 400 of another example embodiment of a circuit 402 for serial data applications. The circuit 402 includes two SerDes lanes, that is, the SerDes lanes 412a and 412b, along with a COM block 413. It should be understood that the two SerDes lanes, also referred to herein as a dual lane module (DLM) configuration, is for illustrative purposes and that any suitable number of SerDes lanes in combination with the COM block 413 may be employed based on practical connectivity to MACs and any distribution constraints of signals from the COM block 413 to the individual SerDes lanes of the circuit 402.

Each SerDes lane includes a TX, RX, and frac-N PLL. For example, the SerDes lane 412a includes the TX 414a, RX 418a, and frac-N 416a, while the SerDes lane 412b includes the TX 414b, RX 418b, and frac-N 416b. Each SerDes lane, that is, the SerDes lane 412a and the SerDes lane 412b, further includes digital circuitry to interface to a respective logical MAC (not shown), that is, the PNR 422a and PNR 422b, respectively. Included in the COM block 413 is control circuitry that may include the PNR control 423 that may be used for controlling the PNR 422a and PNR 422b. The COM block 413 further includes a common PLL 406 that may be an integer PLL as well as the COM circuitry 424 that may include miscellaneous circuitry that is common within the circuit 402.

Figure 5:
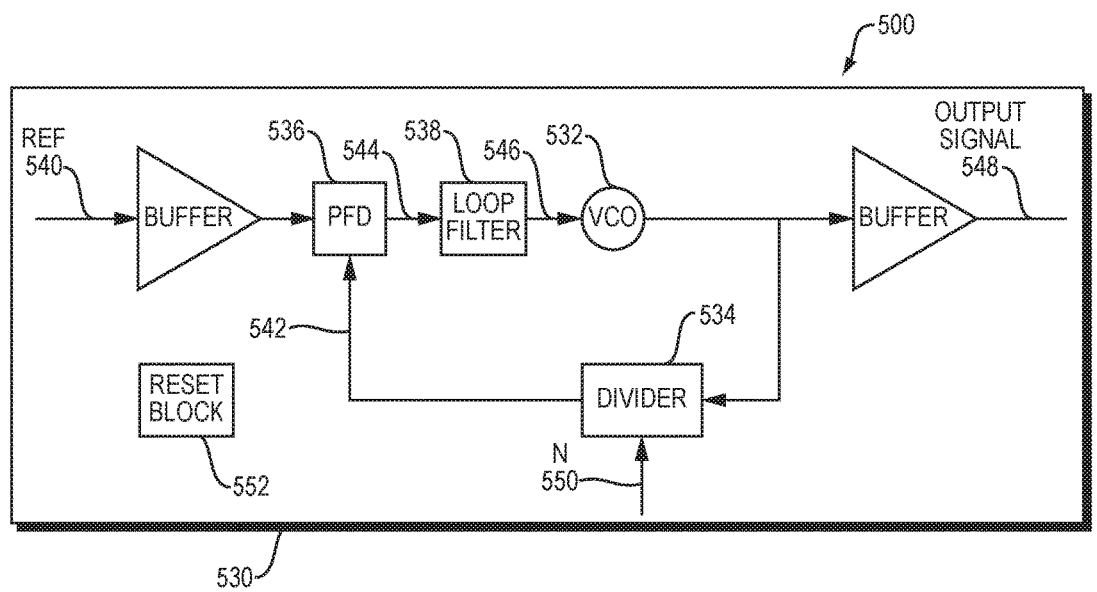
FIG. 5 is a circuit diagram of an example embodiment of a prior art phase locked loop (PLL).

FIG. 5 is a circuit diagram 500 of an example embodiment of a prior art phase locked loop (PLL) 530. The PLL 530 may be used by a SerDes TX (not shown) to clock outgoing data and a SerDes RX (not shown) to clock incoming data. The PLL 530 includes a number of elements, including (but not limited to) a voltage controlled oscillator (VCO) 532, feedback divider 534, phase frequency detector (PFD) 536, and loop filter (LF) 538. The PLL 530 takes in an input reference clock (REF) 540 and compares it to a phase of the divided down VCO output 542 at the PFD 536. An error signal 544 at the output of the PFD 536 is filtered by the LF 538 to produce a filtered output 546 that may be used to control the VCO 532 that generates an output signal 548 with an output frequency that may depend on a control voltage of the filtered output 546.

The LF 538 may be any suitable type of loop filter, such as an integrating loop filter, and the PFD 536 may include a charge-pump (not shown). The output frequency of the output signal 548 may be configured to be $F_{out}=N*F_{ref}$, where N is an integer value, such as the integer N 550 that may be combined and input to the divider 534. As such, the PLL 530 may be referred to as an integer PLL. A reset block 552 may be employed to reset the PLL 530.

Alternatively, a pre-scaler R (not shown) may be configured to divide down the reference clock 540 and a post-scaler P (not shown) may be configured to divide down the output frequency of the output signal 548. As such, the output frequency of the output signal 548 may instead be $F_{out}=N*F_{ref}/(R*P)$ so that some fractional values may be obtained. A stability of an output signal generated by such a PLL, referred to as a fractional PLL, is closely related to a ratio of $(F_{ref}/R)/(PLL\ bandwidth)$. The PLL bandwidth is often set by other considerations for high performance applications, requiring that R=1. The post-scaler P (not shown) is often set to fixed ratios because the VCO 532 may be operating near a highest rate possible to generate clocks needed to achieve particular data rates. The post-scaler P (not shown) may be used to generate output phases. As such, a frequency resolution of the output signal 548 for data rates in practical applications is generally set by N, which is an integer.

Figure 6:
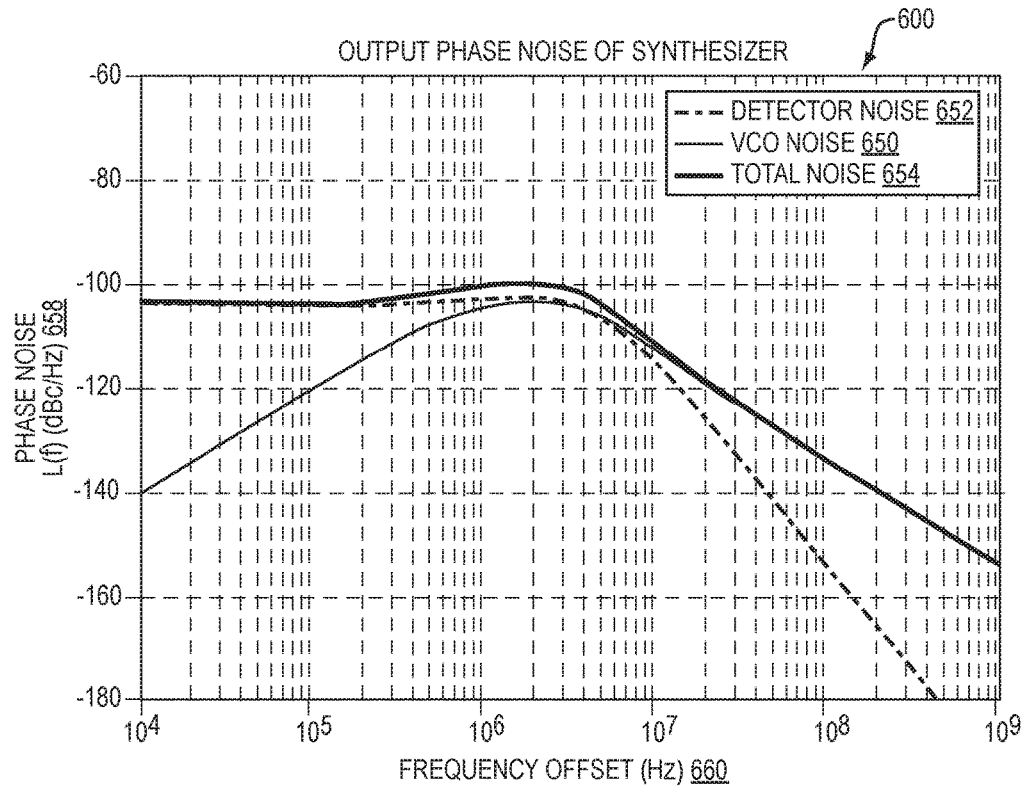
FIG. 6 is a graph of an example embodiment of phase noise of the prior art PLL of FIG. 5.

FIG. 6 is a graph 600 of an example embodiment of phase noise of the prior art PLL 530 (also referred to interchangeably herein as a synthesizer) of FIG. 5. In the graph 600, phase noise 658 with respect to frequency offset 660 is plotted. The graph 600 has plots for the phase noise including plots of the detector phase noise, VCO phase noise, and total phase noise, that is the detector noise 652, VCO noise 650, and total noise 654, respectively, for the PLL 530. Such phase noise with respect to frequency offset is a typical performance metric for a PLL.

In the graph 600, the VCO noise 650 is the VCO phase noise of the VCO 532 and the detector noise 652 is the phase noise of the PFD 536. LF noise (not shown) of the LF 538 also contributes noise, but has been withheld from the graph 600 so as not to confuse the graph 600. In the example embodiment, it can be assumed that the LF noise (not shown) is set low enough to not be dominant in the PLL 530. A total PLL noise 654 for the PLL 530 corresponds to a sum of the two noise sources, that is, the VCO noise 650 and the PFD noise 652, with respect to the frequency offset 660.

The PFD noise 652 is low pass filtered by the PLL 530, while the VCO noise 650 is high pass filtered. As such, the PFD noise 652 is dominant at low frequencies and the VCO noise 650 is dominant at high frequencies. An integration of the total PLL noise 654 may be converted to total jitter, which, in the example embodiment, is 372 fs root-mean-square (rms). In the example embodiment of the PLL 530, a frequency of the input reference clock signal 540 is assumed to be in a range of 100-156 MHz, which is typical for modern SerDes applications. In order to de-couple a choice of frequency resolution (and therefore data rate resolution) from the reference clock 540, an example embodiment may convert the PLL 530 into a fractional-N synthesizer (also referred to interchangeably herein as a PLL) as disclosed with regard to FIG. 7, below.

Figure 7:
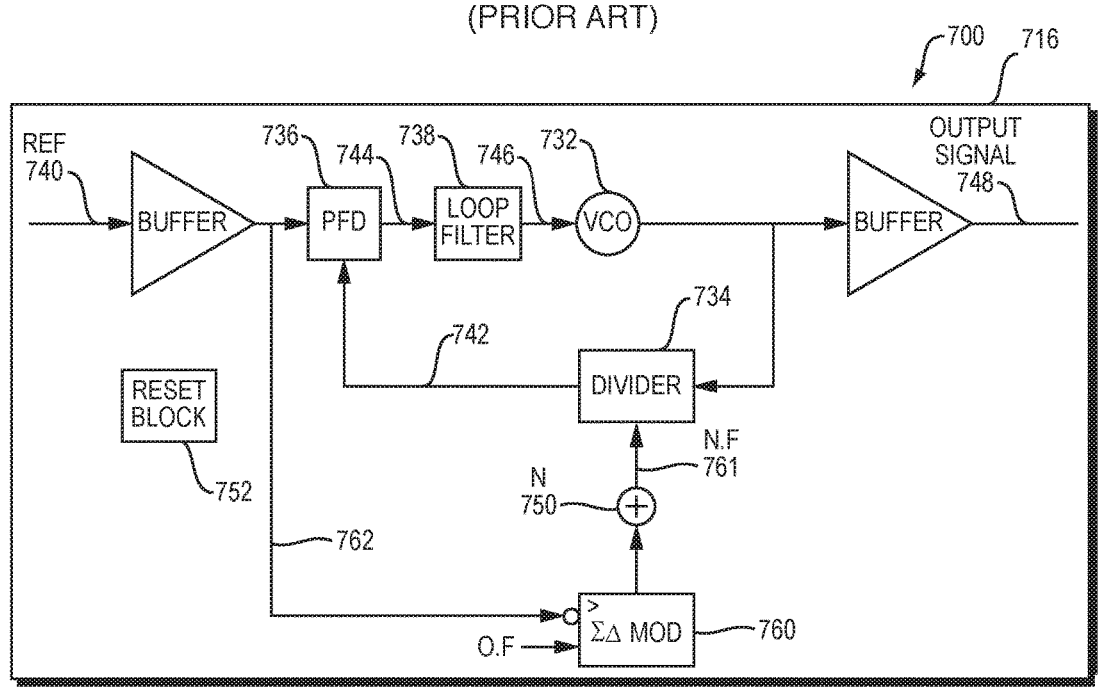
FIG. 7 is a circuit diagram of an example embodiment of a fractional-N (frac-N) PLL.

FIG. 7 is a circuit diagram 700 of an example embodiment of a fractional-N (frac-N) PLL 716. A reset block 752 may be employed to reset the PLL 716. The frac-N PLL 716 includes a number of elements, including (but not limited to) a voltage controlled oscillator (VCO) 732, feedback divider 734, phase frequency detector (PFD) 736, and loop filter (LF) 738. The frac-N PLL 716 takes in an input reference clock signal (REF) 740 and compares it to a phase of the divided down VCO output 742 at the PFD 736. An error signal 744 at the output of the PFD 736 is filtered by the LF 738 to produce a filtered output 746 that may be used to control the VCO 732 that generates an output signal 748 with an output frequency that may depend on a control voltage of the filtered output 746. The LF 738 may be any suitable type of loop filter, such as an integrating loop filter, and the PFD 736 may include a charge-pump (not shown).

In the example embodiment of the PLL 716, a divide value N 750 is modulated between integer values in a way that, on average, a fractional divide value N·F 761 is obtained where N is an integer and F is a fractional value. Modulation of the divide value N 750 may introduce quantization noise. An example embodiment may modulate the divider 734 of the PLL 716 in randomized manner using a sigma-delta modulator 760 to shape the quantization noise so that the quantization noise is high-pass filtered and then low-pass filtered by the PLL 716. The input reference clock signal (REF) 740 may drive the sigma-delta modulator 760 in any suitable manner. For example, the input reference clock signal (REF) 740 may drive the sigma-delta modulator 760, directly, or in a buffered form 762. Further, the input reference clock signal (REF) 740 may be inverted or altered in some other suitable manner to meet timing margins for the PLL 716.

Figure 8:
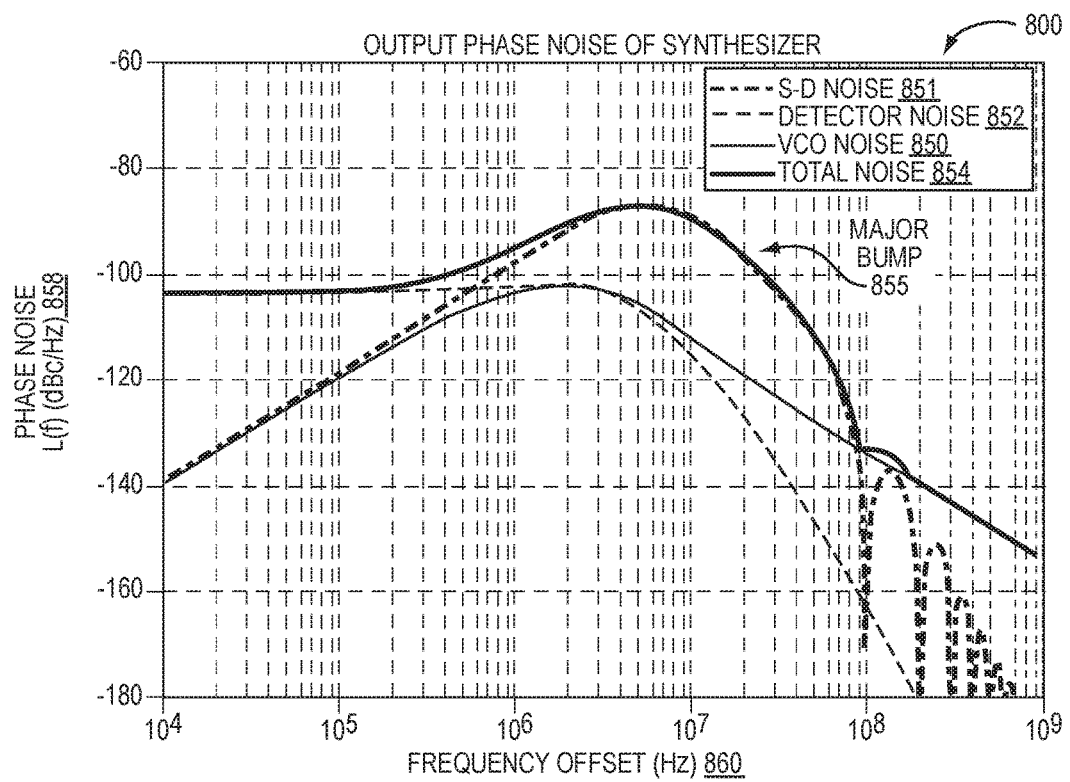
FIG. 8 is a graph of an example embodiment of phase noise of the frac-N PLL of FIG. 7 with a second order sigma-delta modulator.

FIG. 8 is a graph 800 of an example embodiment of phase noise of the frac-N PLL of FIG. 7 with a second order sigma-delta modulator employed as the sigma-delta modulator 760. In the graph 800, phase noise 858 with respect to frequency offset 860 is plotted. Phase noise of the sigma-delta modulator 760, that is, the sigma-delta (S-D) noise 851, is plotted along with the detector noise 852 and the VCO noise 850, of the PFD 736 and the VCO 732, respectively, as well as the total noise 854. In the example embodiment, the PLL output frequency of the PLL output signal 748 is $F_{out}=N·F*F_{ref}$, where N is an integer and F is a fractional value.

According to an example embodiment, the phase noise response of FIG. 8 may be improved, as a major hump 855 in the total phase noise 854 is due to the frac-N modulation process. Specifically, integrated jitter has increased from 372 fs rms to 2.294 ps rms. Noise due to the frac-N modulation process is denoted as the S-D noise 851 and is large because modulation of the divider 734 can only occur at $F_{ref}$, that is, an input frequency of the input reference clock signal 740 which is only at 100 to 156 MHz, that is, a frequency range that customers are typically willing to provide. A magnitude of such quantization phase noise such as the major hump 855, may be derived from the equation:

$$\frac{\Delta^2}{12} \cdot \left[ 2\,\sin\left(\frac{\pi f}{f_{ref}}\right) \right]^{2M} \quad (1)$$

In Eq. (1), above, Δ represents a quantization step size (1 divide value step), M is an order of the sigma-delta modulator, where (M=2 in the example embodiment of FIG. 8) and $f_{ref}$ is a reference frequency, that is, the reference frequency of the input reference clock signal 740, that is input to the PLL. Based on Eq. (1), above, options for reducing an impact of the S-D noise 751 may include reducing Δ, increasing $f_{ref}$, adjusting M, or performing a combination thereof.

Figure 9:
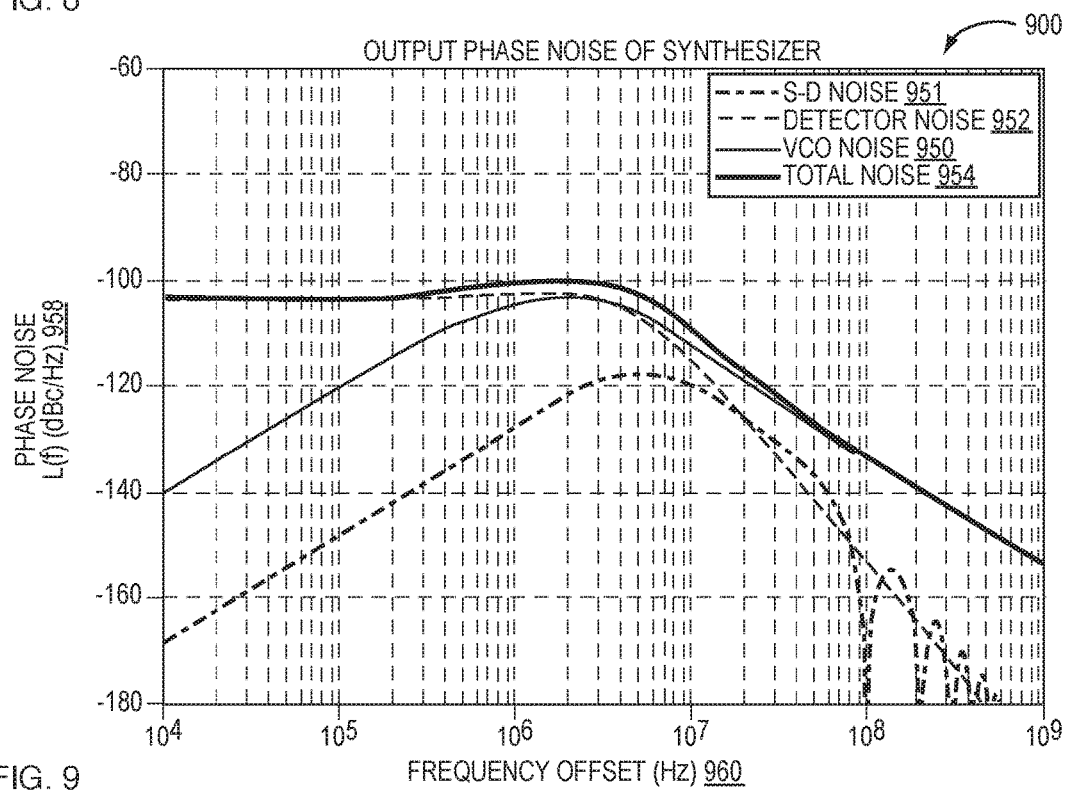
FIG. 9 is a graph of an example embodiment of an improved phase noise response relative to the phase noise response of FIG. 8.

FIG. 9 is a graph 900 of an example embodiment of an improved phase noise response relative to the phase noise response of FIG. 8, disclosed above. In the graph 900, phase noise 958 with respect to frequency offset 960 is plotted. Phase noise of the sigma-delta modulator 760, that is, the sigma-delta (S-D) noise 951, is plotted along with the detector noise 952 and the VCO noise 950, of the PFD 736 and the VCO 732, respectively, as well as the total noise 954. To achieve the improved phase noise response, a magnitude of the quantization step size, that is, 4, is reduced. To reduce the magnitude of the quantization step size, the quantization noise may be partially cancelled or sub-phases of the VCO 732 may be used as a step size in performing the feedback selection and modulation comparison (so that Δ<1). However, either of these options are costly in area and power and risky in that they don't offer guaranteed reduction of the quantization noise because they rely on matching of phases or cancellation paths. An example embodiment disclosed herein takes advantage of the design of Eq. (1), disclosed above, to virtually remove an impact of the quantization noise without using any complex noise cancellation methods.

Figure 10:
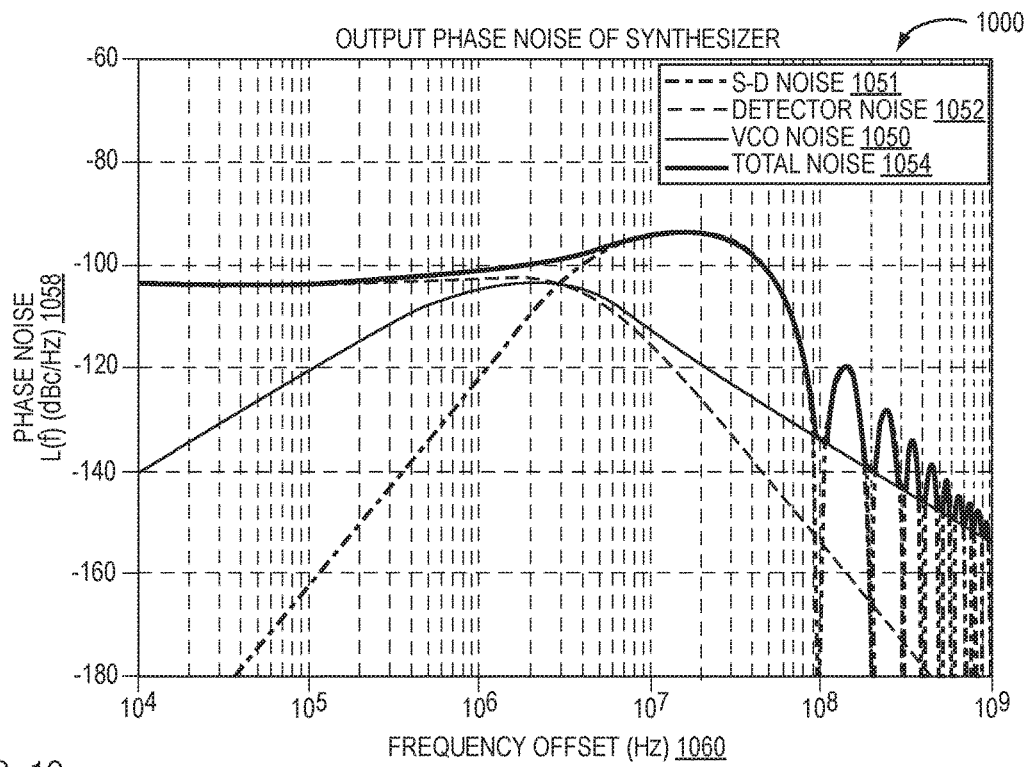
FIG. 10 is a graph of another improved phase noise response relative to the phase noise response of FIG. 8.

FIG. 10 is a graph 1000 of another improved phase noise response relative to the phase noise response of FIG. 8, disclosed above. In the graph 1000, phase noise 1058 with respect to frequency offset 1060 is plotted. Phase noise of the sigma-delta modulator 760, that is, the sigma-delta (S-D) noise 1051, is plotted along with the detector noise 1052 and the VCO noise 1050, of the PFD 736 and the VCO 732, respectively, as well as the total noise 1054. In the example embodiment of FIG. 10, a $3^{rd}$ order modulator is employed as the sigma-delta modulator 760. In the example embodiment of FIG. 10, the quantization noise has been moved to higher frequencies, in accordance with Eq. (1), disclosed above. While the total rms jitter is now reduced to 1.885 ps, the quantization noise may still be considered unacceptably high.

Figure 11:
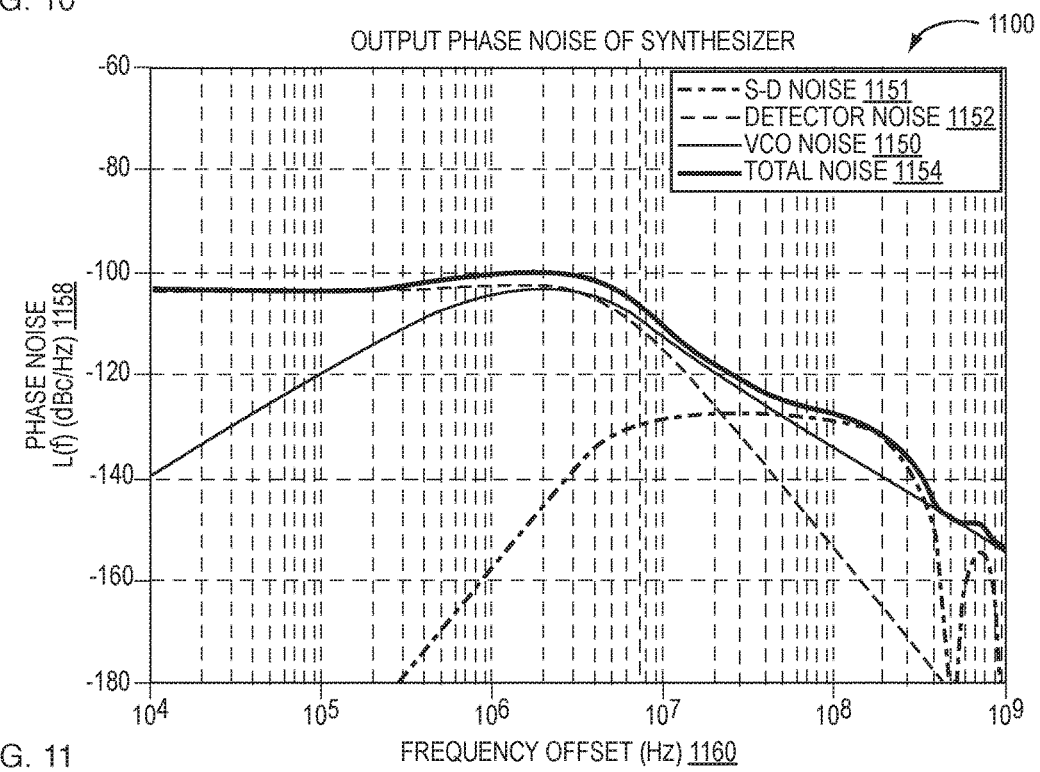
FIG. 11 is a graph of a phase noise response for an example embodiment of a synthesizer in which an input frequency is increased to 500 MHz.

FIG. 11 is a graph 1100 of a phase noise response for an example embodiment of a synthesizer in which an input frequency is increased to 500 MHz. The graph 1100 shows an improved phase noise response relative to the phase noise response of FIG. 10, disclosed above. In the graph 1100, phase noise 1158 with respect to frequency offset 1160 is plotted. Phase noise of the sigma-delta modulator 760, that is, the sigma-delta (S-D) noise 1151, is plotted along with the detector noise 1152 and the VCO noise 1150, of the PFD 736 and the VCO 732, respectively, as well as the total noise 1154. In the example embodiment, the reference frequency of the input reference clock signal 740, that is, the input frequency $F_{ref}$, is increased to 500 MHz.

In the example embodiment, the quantization noise is reduced by shifting it to higher frequency, where a loop filter, such as the LF 738 of the PLL 716 of FIG. 7, disclosed above, may be more effective in filtering it. The rms jitter of the example embodiment of FIG. 11 is reduced to 381 fs. The higher $F_{ref}$ may be generated by an on-chip PLL, such as the common PLL 106, the common PLL 306, or the common PLL 406 of FIG. 1, FIG. 3, or FIG. 4, respectively. The on-chip PLL may be configured to frequency multiply an off-chip low frequency reference clock signal with a frequency in a range from 100-156 MHz to another frequency, also referred to herein as a sigma delta reference, that is in a range of 400-600 MHz.

An exact frequency of such a sigma delta reference is not important. Such a frequency may be configured such that it is "high enough" to get sufficient suppression of the quantization noise. Such a frequency may be in the 400-600 MHz range, a frequency that may be distributed easily across a large die for all SerDes lanes from a common multiplier PLL, such as the common PLL 106, the common PLL 306, or the common PLL 406 of FIG. 1, FIG. 3, or FIG. 4, respectively. An additional benefit of such an embodiment is that by moving a SerDes lane PLL reference clock to a higher frequency, reference clock spur suppression may be more effective as the SerDes lane PLL reference clock may now be configured with what is considered to be a high frequency.

Figure 12:
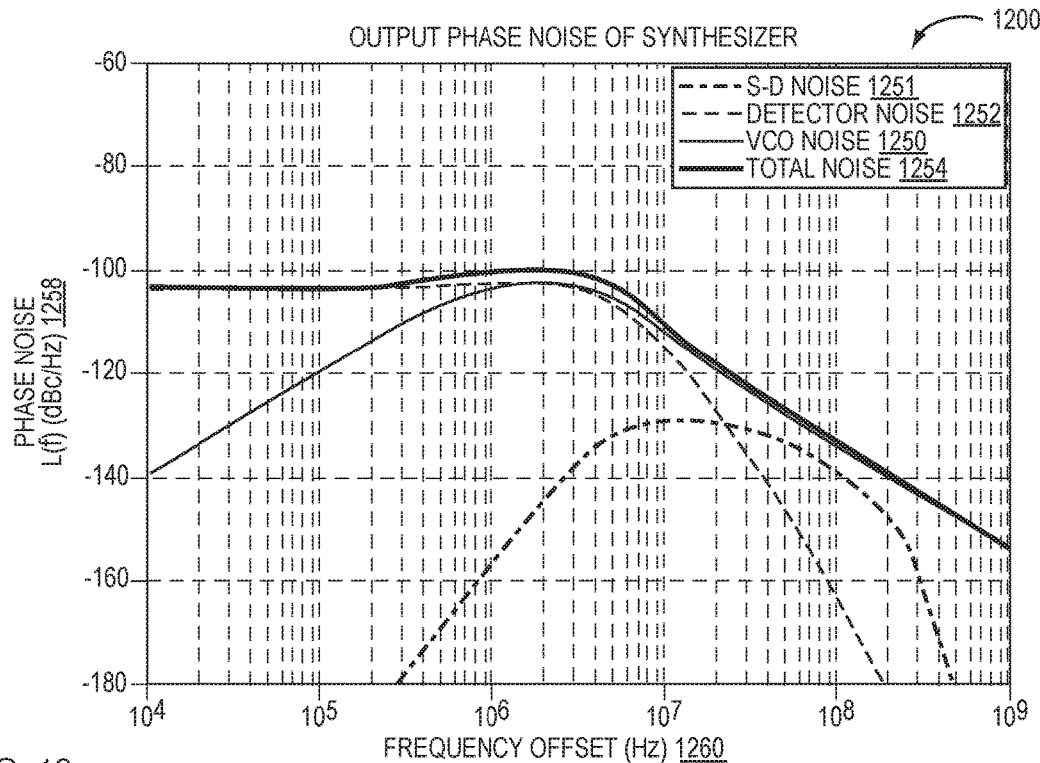
FIG. 12 is a graph of an example embodiment of a phase response for a frac-N PLL that employs a high frequency, out-of-band pole.

FIG. 12 is a graph 1200 of an example embodiment of a phase response for a frac-N PLL that employs a high frequency, out-of-band pole. Phase noise of the sigma-delta modulator 760, that is, the sigma-delta (S-D) noise 1251, is plotted along with the detector noise 1252 and the VCO noise 1250, of the PFD 736 and the VCO 732, respectively, as well as the total noise 1254. According to the example embodiment, the pole may be configured to have minimal impact of closed loop synthesizer performance around the PLL bandwidth, that is, it has no impact with regard to the PLL bandwidth or peaking, yet offers additional filtering suppression at higher offset frequencies. As such, the out-of-band pole suppresses the remaining quantization noise without adding additional power.

In the example embodiment of FIG. 12, the rms jitter is increased slightly to 390 fs rms, which is the result of the closed loop poles moving slightly due to the presence of a parasitic pole at 30 MHz. This is a negligible performance delta and could be further optimized. An additional benefit of such a parasitic pole is that it will filter any reference spur present at 500 MHz substantially more than the PLL would otherwise. More importantly, a performance of such a frac-N synthesizer in terms of jitter and phase noise is now comparable to that of an integer-N PLL. It should be understood that the frac-N synthesizer employs a fractional divide value of N·F, where N is an integer and F is a fractional value, and that the performance of such a frac-N synthesizer (i.e., frac-N PLL) is comparable in terms of jitter and phase noise to that of the integer-N PLL, where the integer-N PLL employs a same integer divide value for N as the frac-N synthesizer.

The common PLL 106 may be an integer PLL with a multiplying factor and the multiplying factor may be configured to suppress an initial portion of quantization noise introduced by modulating each respective divide value of each respective divider of each respective frac-N PLL 116*a*-*n* of the plurality of SerDes lanes 112*a*-*n*. Each respective frac-N PLL 116*a*-*n* of the plurality of SerDes lanes 112*a*-*n* may be further composed of a respective out-of-band parasitic pole (not shown) that is configured to suppress a remaining portion of the quantization noise. The remaining portion may be at higher offset frequencies relative to offset frequencies of the initial portion. The initial portion and the remaining portion may be suppressed below a noise level of noise generated from intrinsic phase detector (not shown) and voltage controlled oscillator (VCO) noise sources (not shown) on the chip 104.

Each respective out-of-band parasitic pole (not shown) may be configured high enough to not affect closed-loop behavior of the respective frac-N PLL 116*a*-*n*. Each respective out-of-band parasitic pole (not shown) in combination with configuration of the multiplying factor may enable jitter and phase noise performance of each respective frac-N PLL of the plurality of SerDes lanes to be comparable to that of an integer PLL that employs a same integer divide value as the respective frac-N PLL, such as disclosed above with regard to FIG. 12.

Figure 13:
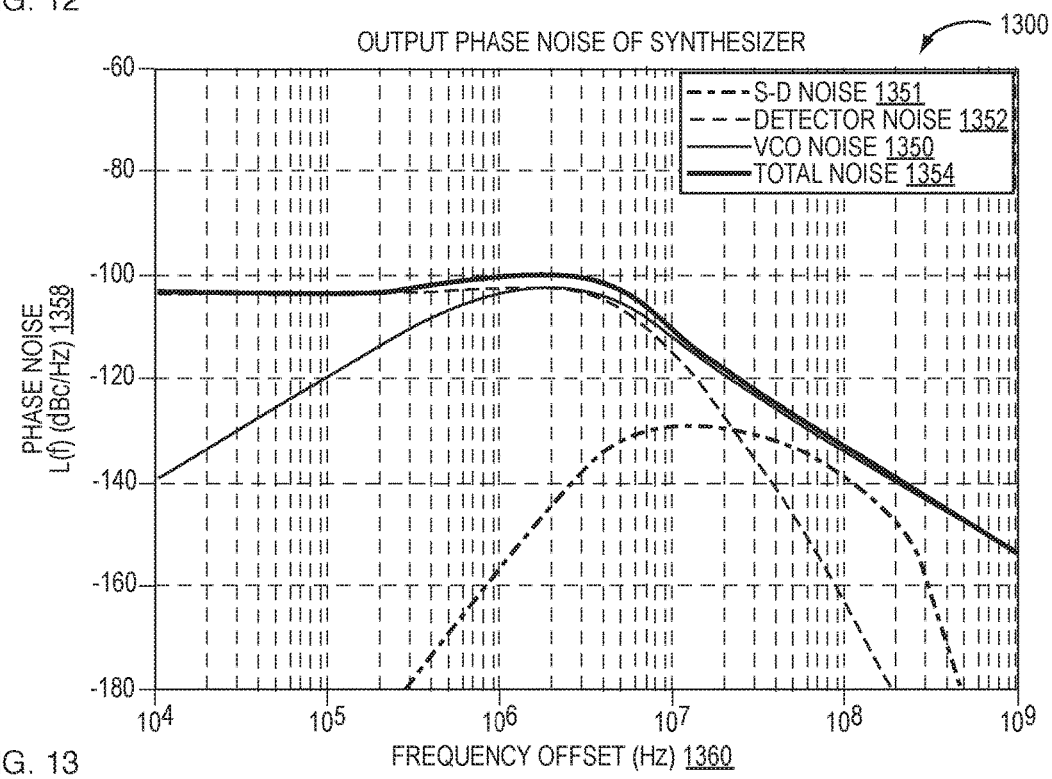
FIG. 13 is a graph 1300 of a phase response of an example embodiment of a synthesizer with a modulator that is dithered at a low frequency so that it is sufficiently randomized.

FIG. 13 is a graph 1300 of a phase response of an example embodiment of a synthesizer with a modulator that is dithered at a low frequency so that it is sufficiently randomized. Phase noise of the sigma-delta modulator 760, that is, the sigma-delta (S-D) noise 1351, is plotted along with the detector noise 1352 and the VCO noise 1350, of the PFD 736 and the VCO 732, respectively, as well as the total noise 1354. Such dithering avoids fractional spurs from appearing in the spectrum, which would translate into additional jitter. According to an example embodiment, such dithering may be performed by coupling a least significant bit (LSB) of the modulator, such as the sigma-delta modulator 760, to a high reference value, or by adding a pseudorandom binary sequence (PRBS) of sufficient length to the LSB of the modulator.

Figure 14:
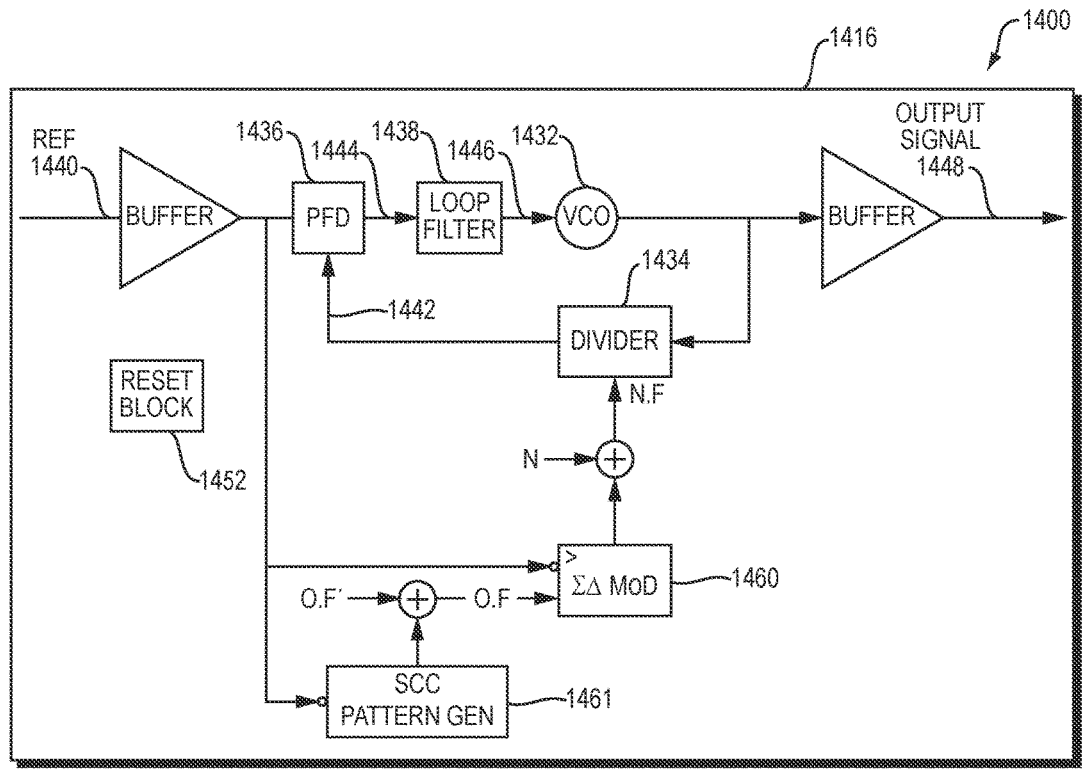
FIG. 14 is a circuit diagram of an example embodiment of another frac-N PLL.

FIG. 14 is a circuit diagram 1400 of an example embodiment of another frac-N PLL 1416. A reset block 1452 may be employed to reset the PLL 1416. The frac-N PLL 1416 includes a number of elements, including (but not limited to) a voltage controlled oscillator (VCO) 1432, feedback divider 1434, phase frequency detector (PFD) 1436, and loop filter (LF) 1438. The frac-N PLL 1416 takes in an input reference clock signal (REF) 1440 and compares it to a phase of the divided down VCO output 1442 at the PFD 1436. An error signal 1444 at the output of the PFD 1436 is filtered by the LF 1438 to produce a filtered output 1446 that may be used to control the VCO 1432 that generates an output signal 1448 with an output frequency that may depend on a control voltage of the filtered output 1446. The LF 1438 may be any suitable type of loop filter, such as an integrating loop filter, and the PFD 1436 may include a charge-pump (not shown). The frac-N PLL 1416 further includes a sigma-delta modulator 1460 and a digital spread-spectrum profile generator, that is, the spread spectrum clock (SSC) pattern generator 1461 that may be configured to modulate the synthesizer.

Such modulation is useful because many serial data standards require generation of spread spectrum clocks (SSC). Without frac-N capabilities, it becomes complex to generate SSC profiles and such complex generation may tap multiple VCO output phases or be based on generation of multiple output phases to create such profiles. According to the example embodiment of FIG. 14, the frac-N PLL 1416 may be modulated, directly, obviating such complex generation.

Turning back to FIG. 1, each respective frac-N PLL 116*a*-*n* of the plurality of SerDes lanes 112*a*-*n* may be composed of a respective divider (not shown) and sigma-delta modulator (not shown), such as the divider 1434 and sigma-delta modulator 1460 of FIG. 14, disclosed above. Each respective sigma-delta modulator may be configured to modulate, randomly, a respective divide value of the respective divider. Each respective frac-N PLL 116*a*-*n* of the plurality of SerDes lanes 112*a*-*n* may have an order that is lower relative to that of the respective sigma-delta modulator. The order of each respective frac-N PLL may be two and that of the respective sigma-delta modulator may be three; however, any suitable order may be employed for each respective frac-N PLL and the respective sigma-delta modulator. For example, for practical reasons an order of the respective sigma-delta modulator may be greater than or equal to one and an order of each respective frac-N PLL may be of order two or higher. Orders of each respective frac-N PLL and sigma-delta modulator may be co-optimized to yield best phase noise and jitter performance in the circuit 102. The circuit 102 may be configured to suppress a respective modulation noise, generated by each respective frac-N PLL 116*a*-*n*, by increasing frequency of the respective modulation noise to enable each respective frac-N PLL to filter the respective modulation noise.

Figure 15:
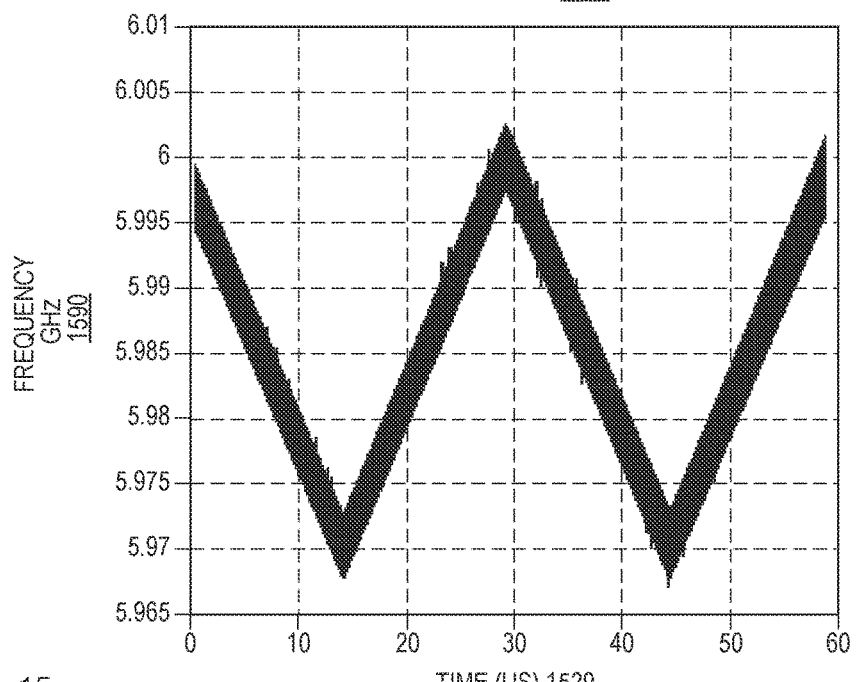
FIG. 15 is a graph of an example embodiment of a simulated PLL output.

FIG. 15 is a graph 1500 of an example embodiment of a simulated PLL output 1548. The graph 1500 plots the frequency 1590 over time 1529 for the simulated PLL output 1548. The simulated PLL output 1548 is a simulated output signal of a frac-N PLL, such as the frac-N PLL 1416 of FIG. 14, disclosed above, modulated by a down-spread SSC profile, such as the frac-N PLL of FIG. 14, disclosed above, according to the Serial ATA (Advanced Technology Attachment) (SATA) specification. According to the example embodiment, a triangular down-spreading profile is achieved. It should be understood that other suitable profiles, such as up spread, center spread, square-wave, etc., may be employed. Turning back to FIG. 1, each respective frac-N PLL 116*a*-*n* of the plurality of SerDes lanes 112*a*-*n* may be composed of a respective spread spectrum clock (SSC) pattern generator, such as the SSC pattern generator 1461 of FIG. 14, disclosed above, that may be configured to modulate the respective frac-N PLL, directly, according to a respective SSC profile (not shown).

Figure 16A:
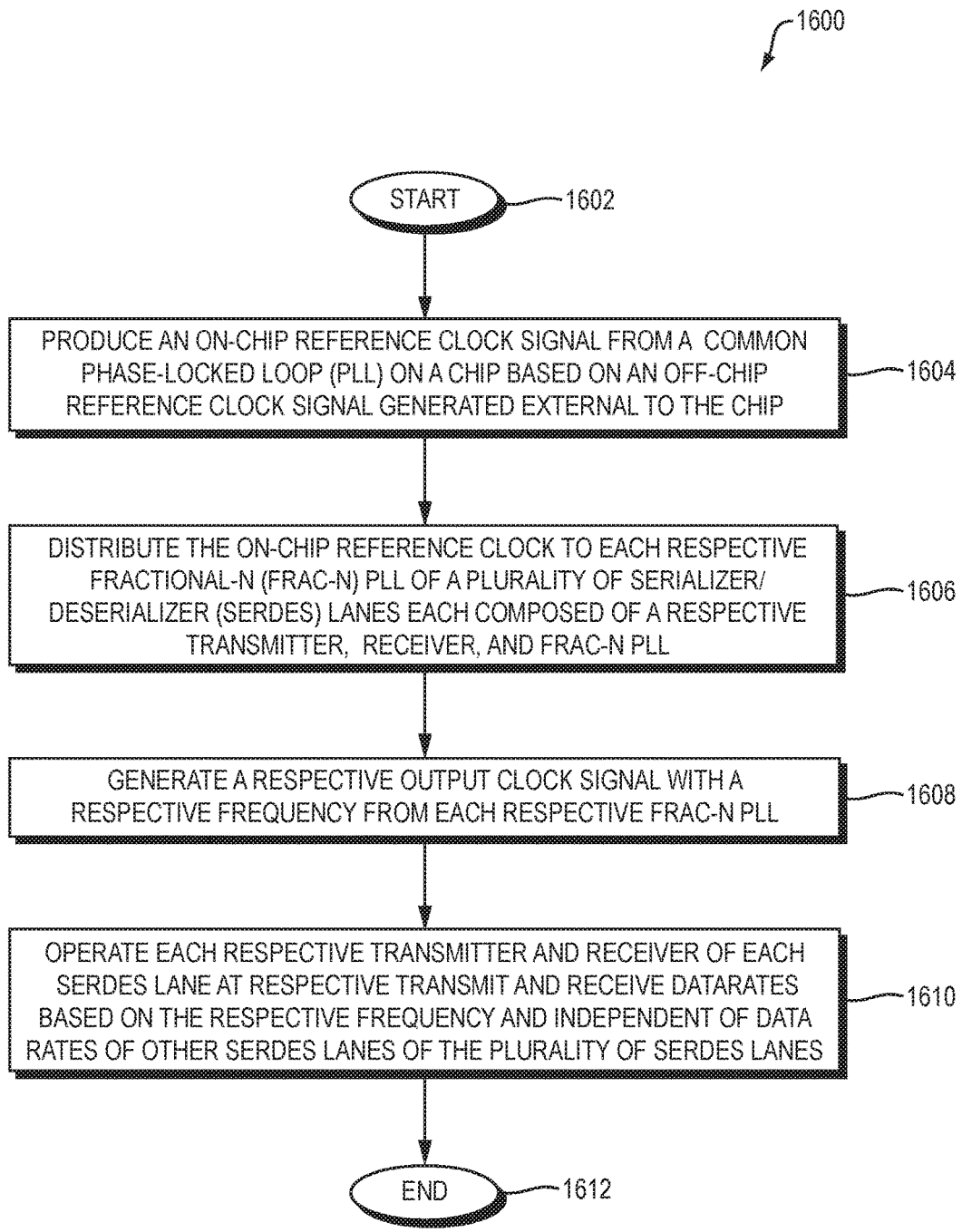
FIG. 16A is flow diagram of an example embodiment of a method for achieving serializer/deserializer (SerDes) lane datarate independence.

FIG. 16A is flow diagram 1600 of an example embodiment of a method for achieving serializer/deserializer (SerDes) lane datarate independence. The method may begin (1602) and produce an on-chip reference clock signal from a common phase-locked loop (PLL) on a chip based on an off-chip reference clock signal generated external to the chip (1604). The on-chip reference clock signal may be higher in frequency relative to the off-chip reference clock signal. The method may distribute the on-chip reference clock signal to each respective frac-N PLL of a plurality of serializer/deserializer (SerDes) lanes each composed of a respective transmitter, receiver, and fractional-N (frac-N) PLL (1606). The method may generate a respective output clock signal with a respective frequency from each respective frac-N PLL based on the on-chip reference clock signal distributed (1608). The method may operate each respective transmitter and receiver of each SerDes lane at respective transmit and receive data rates that may be based on the respective frequency and may be independent of data rates of other SerDes lanes of the plurality of SerDes lanes (1610) and the method thereafter ends (1612) in the example embodiment.

Figure 16B:
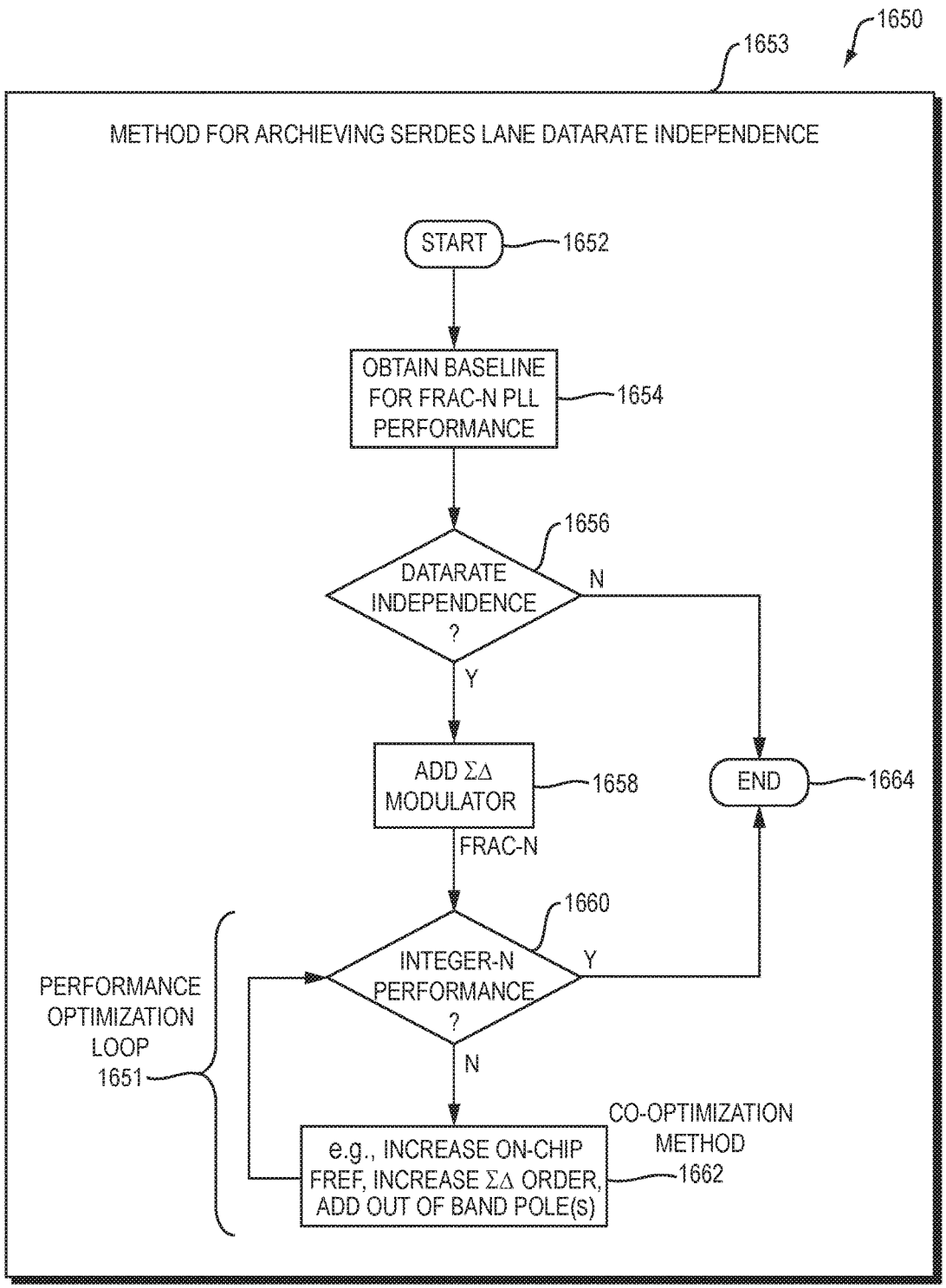
FIG. 16B is flow diagram of another example embodiment of a method for achieving SerDes lane datarate independence.

FIG. 16B is flow diagram 1650 of another example embodiment of a method for achieving SerDes lane datarate independence (1653). The method may begin (1652) and obtain a baseline for frac-N PLL performance of a frac-N PLL employed in a SerDes lane, such as disclosed above with reference to FIG. 1. The method may check for whether SerDes lane datarate independence is desired (1656). If not, the method thereafter ends (1664) in the example embodiment. However, if SerDes lane datarate independence is desired, the method may add a sigma-delta (i.e., $\Sigma\Delta$) modulator (1658), such as the sigma-delta modulator 760 or the sigma-delta modulator 1460, disclosed above with reference to FIG. 7 and FIG. 14, respectively.

The method may check whether a performance of the frac-N PLL is comparable to that of an integer PLL that employs a same integer divide value as the frac-N PLL (1660). If the performance is comparable, the method thereafter ends (1664) in the example embodiment. However, if the performance is not comparable, the method may perform a co-optimization method (1662) with respect to (i) an on-chip frequency reference value ($F_{ref}$) of a frequency of an on-chip reference clock signal distributed to the frac-N PLL, such as the on-chip reference clock signal 110 of FIG. 1, disclosed above, (ii) an order of the sigma-delta modulator, and (iii) out-of-band poles. For example, the co-optimization method (1662) may increase the on-chip frequency reference value, increase the order of the sigma-delta modulator, or add out of band pole(s), or a combination thereof. Following the co-optimization method (1662), the method may again check whether the performance of the frac-N PLL is comparable to that of an integer PLL that employs a same integer divide value as the frac-N PLL (1660).

If yes, the method thereafter ends (1664) in the example embodiment. If no, the method may again employ the optimization method (1662). As such, the method (1653) may iterate an optimization loop 1651 an iterate performing the optimization method (1662) until the performance of the frac-N PLL is comparable to that of an integer PLL that employs a same integer divide value as the frac-N PLL, enabling datarate independence of the SerDes lane relative to other SerDes lanes. By recognizing tradeoffs between choosing an input frequency to a frac-N PLL, an order of a sigma-delta modulator (i.e., $\Sigma\Delta$), and out of band poles, an influence of quantization noise on the frac-N PLL performance may be minimized or eliminated while employing a frac-N PLL.

It should be understood that the method (1653) may be employed from SerDes lane-to-lane or employed for a single lane and applied to multiple SerDes lanes. For example, selection of input frequency to a frac-N PLL, an order of a sigma-delta modulator (i.e., $\Sigma\Delta$), and out-of-band poles determined as a result of the optimization loop 1651, may be applied to all SerDes lanes of a circuit, such as the circuit 102 of FIG. 1, disclosed above. Such selection may be based on all datarates required to be supported by the circuit.

Alternatively, local frequency division of the on-chip frequency reference value may be employed with any given SerDes lane and each SerDes lane may employ a respective order of its respective sigma-delta modulator and respective out-of-band poles that are selected for the given SerDes lane independent of selections made for other SerDes lanes. Factors such as power and performance requirements may influence the selection of the input frequency to the frac-N PLL, the order of a sigma-delta modulator (i.e., IA), and the out-of-band poles that may be employed.

While example embodiments have been particularly shown and described, it will be understood by those skilled in the art that various changes in form and details may be made therein without departing from the scope of the embodiments encompassed by the appended claims.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:

1. A circuit on a chip for serial data applications, the circuit comprising:
   a common phase-locked loop (PLL) having a multiplying factor, the common PLL configured to produce an on-chip reference clock signal; and
   a serializer/deserializer (SerDes) lane, the SerDes lane including a fractional-N (frac-N) PLL, the frac-N PLL including an out-of-band parasitic pole, the on-chip reference clock signal distributed to the frac-N PLL, the multiplying factor in combination with the out-of-band parasitic pole configured to suppress quantization noise introduced by modulating the frac-N PLL.

2. The circuit of claim 1, wherein the common PLL is configured to receive an off-chip reference clock signal generated external to the chip and wherein the on-chip reference clock signal is higher in frequency relative to the off-chip reference clock signal.

3. The circuit of claim 2, wherein the off-chip reference clock signal is configured to operate in a low frequency range of 100 MHz to 156 MHz and the on-chip reference clock signal is configured to operate in a higher frequency range of 400 MHz to 600 MHz.

4. The circuit of claim 1, wherein the circuit is configured to suppress modulation noise, generated by the frac-N PLL, by increasing frequency of the modulation noise to enable the frac-N PLL to filter the modulation noise.

5. The circuit of claim 1, wherein the frac-N PLL further includes a divider with a divide value, wherein the multiplying factor is configured to suppress an initial portion of the quantization noise, and wherein modulating the frac-N PLL includes modulating the divide value of the divider.

6. The circuit of claim 5, wherein the out-of-band parasitic pole is configured to suppress a remaining portion of the quantization noise, the remaining portion at higher offset frequencies relative to offset frequencies of the initial portion, the initial portion and the remaining portion suppressed below a noise level of noise generated from intrinsic phase detector and voltage controlled oscillator (VCO) noise sources on the chip.

7. The circuit of claim 1, wherein the frac-N PLL includes a divider and sigma-delta modulator, the sigma-delta modulator configured to modulate, randomly, a divide value of the divider.

8. The circuit of claim 7, wherein the frac-N PLL has an order that is lower relative to that of the sigma-delta modulator.

9. The circuit of claim 8, wherein the order of the frac-N PLL is two and that of the sigma-delta modulator is three.

10. The circuit of claim 1, wherein the common PLL is a first integer PLL, wherein the out-of-band parasitic pole is configured high enough to not affect closed-loop behavior of the frac-N PLL, and wherein the out-of-band parasitic pole in combination with configuration of the multiplying factor enable jitter and phase noise performance of the frac-N PLL to be comparable to that of a second integer PLL that employs a same integer divide value as the frac-N PLL.

11. The circuit of claim 1, wherein the frac-N PLL further includes a spread spectrum clock (SSC) pattern generator configured to modulate the frac-N PLL, directly, according to an SSC profile.

12. The circuit of claim 1, wherein:
the chip is a physical layer device (PHY);
the SerDes lane includes a transmitter configured to operate at a transmit data rate and a receiver configured to operate at a receive data rate;
the SerDes lane is configured to employ the transmit and receive data rates to communicate with a media access controller (MAC); and
the transmit and receive data rates are configured independent of data rates employed by other SerDes lanes of the PHY for communicating with other MACs.

13. A circuit on a chip for serial data applications, the circuit comprising:
a common phase-locked loop (PLL) having a multiplying factor, the common PLL configured to produce an on-chip reference clock signal; and
a serializer/deserializer (SerDes) lane, the SerDes lane including a fractional-N (frac-N) PLL, the frac-N PLL including a divider with a divide value, the on-chip reference clock signal distributed to the frac-N PLL, the multiplying factor configured to suppress a portion of quantization noise, the portion introduced by modulating the divide value of the divider of the frac-N PLL.

14. The circuit of claim 13, wherein the common PLL is configured to receive an off-chip reference clock signal generated external to the chip and wherein the on-chip reference clock signal is higher in frequency relative to the off-chip reference clock signal.

15. The circuit of claim 14, wherein the off-chip reference clock signal is configured to operate in a low frequency range of 100 MHz to 156 MHz and the on-chip reference clock signal is configured to operate in a higher frequency range of 400 MHz to 600 MHz.

16. The circuit of claim 13, wherein the circuit is configured to suppress modulation noise, generated by the frac-N PLL, by increasing frequency of the modulation noise to enable the frac-N PLL to filter the modulation noise.

17. The circuit of claim 13, wherein the frac-N PLL further includes a sigma-delta modulator, the sigma-delta modulator configured to modulate, randomly, the divide value of the divider.

18. The circuit of claim 13, wherein the portion is an initial portion and wherein the frac-N PLL further includes of an out-of-band parasitic pole configured to suppress a remaining portion of the quantization noise, the remaining portion at higher offset frequencies relative to offset frequencies of the initial portion, the initial portion and the remaining portion suppressed below a noise level of noise generated from intrinsic phase detector and voltage controlled oscillator (VCO) noise sources on the chip.

19. The circuit of claim 13, wherein the common PLL is a first integer PLL, wherein the frac-N PLL further includes an out-of-band parasitic pole configured high enough to not affect closed-loop behavior of the frac-N PLL, and wherein the out-of-band parasitic pole in combination with configuration of the multiplying factor enable jitter and phase noise performance of the frac-N PLL to be comparable to that of a second integer PLL that employs a same integer divide value as the frac-N PLL.

20. The circuit of claim 13, wherein the frac-N PLL further includes a sigma-delta modulator and wherein the frac-N PLL has an order that is lower relative to that of the sigma-delta modulator.

21. The circuit of claim 20, wherein the order of the frac-N PLL is two and that of the sigma-delta modulator is three.

22. The circuit of claim 13, wherein the frac-N PLL further includes a spread spectrum clock (SSC) pattern generator configured to modulate the frac-N PLL, directly, according to an SSC profile.

23. The circuit of claim 13, wherein:
the chip is a physical layer device (PHY);
the SerDes lane includes a transmitter configured to operate at a transmit data rate and a receiver configured to operate at a receive data rate;
the SerDes lane is configured to employ the transmit and receive data rates to communicate with a media access controller (MAC); and
the transmit and receive data rates are configured independent of data rates employed by other SerDes lanes of the PHY for communicating with other MACs.

24. A circuit on a chip for serial data applications, the circuit comprising:
a common phase-locked loop (PLL), the common PLL configured to produce an on-chip reference clock signal; and
a serializer/deserializer (SerDes) lane including a fractional-N (frac-N) PLL, the frac-N PLL including a sigma-delta modulator, the on-chip reference clock signal distributed to the frac-N PLL, the frac-N PLL configured to have an order that is lower relative to that of the sigma-delta modulator of the frac-N PLL of the SerDes lane.

25. The circuit of claim 24, wherein the common PLL is configured to receive an off-chip reference clock signal generated external to the chip and wherein the on-chip reference clock signal is higher in frequency relative to the off-chip reference clock signal.

26. The circuit of claim 25, wherein the off-chip reference clock signal is configured to operate in a low frequency range of 100 MHz to 156 MHz and the on-chip reference clock signal is configured to operate in a higher frequency range of 400 MHz to 600 MHz.

27. The circuit of claim 24, wherein the order the frac-N PLL is two and that of the sigma-delta modulator is three.

28. The circuit of claim 24, wherein the circuit is configured to suppress modulation noise, generated by the frac-N PLL, by increasing frequency of the modulation noise to enable the frac-N PLL to filter the modulation noise.

29. The circuit of claim 24, wherein the frac-N PLL further includes a divider, the sigma-delta modulator configured to modulate, randomly, a divide value of the divider.

30. The circuit of claim 24, wherein the frac-N PLL further includes a divider with a multiplying factor and wherein the multiplying factor is configured to suppress an initial portion of quantization noise introduced by modulating the divide value of the divider.

31. The circuit of claim 30, wherein the frac-N PLL further includes an out-of-band parasitic pole configured to suppress a remaining portion of the quantization noise, the remaining portion at higher offset frequencies relative to offset frequencies of the initial portion, the initial portion and the remaining portion suppressed below a noise level of noise generated from intrinsic phase detector and voltage controlled oscillator (VCO) noise sources on the chip.

32. The circuit of claim 31, wherein the common PLL is a first integer PLL, wherein the out-of-band parasitic pole is configured high enough to not affect closed-loop behavior of the frac-N PLL, and wherein the out-of-band parasitic pole in combination with configuration of the multiplying factor enable jitter and phase noise performance of the frac-N PLL to be comparable to that of a second integer PLL that employs a same integer divide value as the frac-N PLL.

33. The circuit of claim 24, wherein the frac-N PLL further includes a spread spectrum clock (SSC) pattern generator configured to modulate the frac-N PLL, directly, according to an SSC profile.

34. The circuit of claim 24, wherein:
the chip is a physical layer device (PHY);
the SerDes lane includes a transmitter configured to operate at a transmit data rate and a receiver configured to operate at a receive data rate;
the SerDes lane is configured to employ the transmit and receive data rates to communicate with a media access controller (MAC); and
the transmit and receive data rates are configured independent of data rates employed by other SerDes lanes of the PHY for communicating with other MACs.

* * * * *

UNITED STATES PATENT AND TRADEMARK OFFICE
CERTIFICATE OF CORRECTION

| | | |
|---|---|---|
| PATENT NO. | : 10,461,917 B2 | Page 1 of 1 |
| APPLICATION NO. | : 16/352180 | |
| DATED | : October 29, 2019 | |
| INVENTOR(S) | : Scott E. Meninger | |

It is certified that error appears in the above-identified patent and that said Letters Patent is hereby corrected as shown below:

In the Specification

Column 4, Line 23, delete "is flow" and insert -- is a flow --, therefor.

Column 4, Line 26, delete "is flow" and insert -- is a flow --, therefor.

Column 8, Line 41, delete "N·F" and insert -- N.F --, therefor.

Column 8, Line 66, delete "$F_{out}=N·F*F_{ref}$," and insert -- $F_{out}=N.F*F_{ref}$, --, therefor.

Column 9, Line 37, delete "4," and insert -- $\Delta$, --, therefor.

Column 10, Line 65, delete "N·F" and insert -- N.F, --, therefor.

Column 12, Line 52, delete "is flow" and insert -- is a flow --, therefor.

Column 13, Line 6, delete "is flow" and insert -- is a flow --, therefor.

Column 13, Line 15, delete "(i.e., EA)" and insert -- (i.e., $\Sigma\Delta$) --, therefor.

Column 14, Line 2, delete "(i.e., IA)," and insert -- (i.e., $\Sigma\Delta$), --, therefor.

In the Claims

Column 16, Line 58, in Claim 30, delete "a multiplying factor and wherein the multiplying factor" and insert -- a divide value and wherein a multiplying factor of the common PLL --, therefor.

Signed and Sealed this
Thirtieth Day of June, 2020

Andrei Iancu
*Director of the United States Patent and Trademark Office*